United States Patent
Wu (10) Patent No.: US 9,472,664 B1
(45) Date of Patent: Oct. 18, 2016

(54) SEMICONDUCTOR DEVICE AND MANUFACTURING METHOD THEREOF

(71) Applicant: Inotera Memories, Inc., Taoyuan (TW)

(72) Inventor: Tieh-Chiang Wu, Taoyuan (TW)

(73) Assignee: INOTERA MEMORIES, INC., Taoyuan (TW)

( * ) Notice: Subject to any disclaimer, the term of this patent is extended or adjusted under 35 U.S.C. 154(b) by 0 days.

(21) Appl. No.: 14/803,100

(22) Filed: Jul. 19, 2015

(51) Int. Cl.
| | |
|---|---|
| *H01L 29/15* | (2006.01) |
| *H01L 31/0312* | (2006.01) |
| *H01L 29/78* | (2006.01) |
| *H01L 29/423* | (2006.01) |
| *H01L 29/16* | (2006.01) |
| *H01L 29/161* | (2006.01) |
| *H01L 29/66* | (2006.01) |
| *H01L 27/108* | (2006.01) |

(52) U.S. Cl.
CPC ......... *H01L 29/7827* (2013.01); *H01L 27/108* (2013.01); *H01L 29/161* (2013.01); *H01L 29/1608* (2013.01); *H01L 29/4236* (2013.01); *H01L 29/66666* (2013.01)

(58) Field of Classification Search
CPC ........... H01L 29/7827; H01L 29/4236; H01L 29/66666; H01L 29/161; H01L 29/1608; H01L 27/108
See application file for complete search history.

(56) References Cited

U.S. PATENT DOCUMENTS

| | | | |
|---|---|---|---|
| 8,629,527 B2 | 1/2014 | Parekh et al. | |
| 2007/0187695 A1* | 8/2007 | Nakamura | H01L 29/0649 257/77 |
| 2008/0203428 A1* | 8/2008 | Choi | H01L 29/1054 257/190 |
| 2011/0147713 A1* | 6/2011 | Pillarisetty | H01L 29/66462 257/24 |
| 2013/0248943 A1 | 9/2013 | Wells et al. | |
| 2013/0341643 A1* | 12/2013 | Kudou | H01L 29/66068 257/77 |
| 2014/0021484 A1* | 1/2014 | Siemieniec | H01L 21/049 257/77 |
| 2014/0103414 A1* | 4/2014 | Koldiaev | H01L 21/845 257/296 |
| 2016/0181384 A1* | 6/2016 | Liu | H01L 29/4236 257/335 |

FOREIGN PATENT DOCUMENTS

CN 102017073 B 4/2014

* cited by examiner

*Primary Examiner* — Victor A Mandala
(74) *Attorney, Agent, or Firm* — CKC & Partners Co., Ltd.

(57) ABSTRACT

The present disclosure provides a semiconductor device including a substrate, a gate structure, a channel layer, a first active region and a second active region. The gate structure is disposed in the substrate. The channel layer is sandwiched between the gate structure and the substrate. A material of the channel layer is selected from the group consisting of silicon-germanium epitaxial material, silicon-carbon epitaxial material, and a combination thereof. The first active region and the second active region are disposed in the substrate and respectively disposed at opposite sides of the gate structure. A method for manufacturing a semiconductor device is provided herein.

13 Claims, 10 Drawing Sheets

SEMICONDUCTOR DEVICE AND MANUFACTURING METHOD THEREOF

BACKGROUND

1. Field of Invention

The present invention relates to a semiconductor device, more particularly to a memory device.

2. Description of Related Art

A Dynamic Random Access Memory (DRAM) is an essential element in many electronic products. In a memory cell, a channel region lies underneath the gate and between the source and the drain. A voltage imposed upon the gate controls the flow of current from the source to the drain within the channel region. Such memory devices are widely used and are easily formed of silicon and silicon oxide.

Silicon is a semiconductor material. In contrast, silicon oxide is an excellent insulator. The interface between silicon and silicon dioxide can be made with extremely high electrical quality, that is, with a very low density of electronic interface states within the energy bandgap of silicon. However, silicon has its limitations such as low carrier mobility and conductivity. In recent years, the conductivity and mobility of silicon can be increased by an ion-doping process. Unfortunately, in a recessed access device, the ion-doping process is difficult to specifically and uniformly form an ion-doped layer between the gate and the substrate.

In this regard, an improved semiconductor structure and manufacturing method for the semiconductor device are still necessary to solve the problems met in the art.

SUMMARY

An aspect of the present invention is to provide a semiconductor device including a substrate, a gate structure, a channel layer, a first active region and a second active region. The gate structure is disposed in the substrate. The channel layer is sandwiched between the gate structure and the substrate. A material of the channel layer is selected from the group consisting of silicon-germanium epitaxial material, silicon-carbon epitaxial material, and a combination thereof. The first active region and the second active region are disposed in the substrate and respectively disposed at opposite sides of the gate structure.

In various embodiments of the present disclosure, the content of germanium, carbon or the both of the channel layer is abruptly or gradually increased from a side of the channel layer contacting the substrate to another side of the channel layer contacting the gate structure.

In various embodiments of the present disclosure, the content of germanium, carbon or the both of the channel layer has a maximum between a side of the channel layer contacting the substrate and another side of the channel layer contacting the gate structure.

In various embodiments of the present disclosure, a memory cell includes the first active region, the gate structure, and the second active region.

In various embodiments of the present disclosure, the semiconductor device further includes a plurality of isolation structures disposed in the substrate, and the memory cell disposed between adjacent two of the isolation structures.

In various embodiments of the present disclosure, the semiconductor device further includes an epitaxial layer disposed between each of the isolation structures and the substrate.

In various embodiments of the present disclosure, a material of the epitaxial layer is consisting essentially of silicon-germanium epitaxial material, silicon-carbon epitaxial material, or silicon-carbon-germanium epitaxial material.

In various embodiments of the present disclosure, the materials of the epitaxial layer and the channel layer are individually $Si_{1-x}Ge_x$, $0<x\leq0.8$; $Si_{1-y}C_y$, $0<y\leq0.3$; or $Si_{1-a-b}Ge_aC_b$, $0<a\leq0.8$, $0<b\leq0.3$.

In various embodiments of the present disclosure, the content of germanium, carbon or the both of the epitaxial layer is abruptly or gradually increased from a side of the epitaxial layer contacting one of the isolation structures to another side of the epitaxial layer contacting the substrate.

In various embodiments of the present disclosure, the content of germanium, carbon or the both of the epitaxial layer has a maximum between a side of the epitaxial layer contacting one of the isolation structures and another side of the epitaxial layer contacting the substrate.

Another aspect of the present invention is to provide a semiconductor device including a substrate, a gate structure, an isolation structure and an epitaxial layer. The gate structure is disposed in the substrate. The active region is disposed in the substrate and disposed at a side of the gate structure. The isolation structure is disposed in the substrate and disposed between two adjacent of the active regions. The epitaxial layer overlies a surface of the isolation structure. A material of the epitaxial layer is selected from the group consisting of silicon-germanium, silicon-carbon, and a combination thereof.

In various embodiments of the present disclosure, the materials of the epitaxial layer and the channel layer are individually $Si_{1-x}Ge_x$, $0<x\leq0.8$, $Si_{1-y}C_y$, $0<y\leq0.3$; or $Si_{1-a-b}Ge_aC_b$, $0<a\leq0.8$, $0<b\leq0.3$.

In various embodiments of the present disclosure, the content of germanium, carbon or the both of the epitaxial layer is abruptly or gradually increased from a side of the epitaxial layer contacting one of the isolation structures to another side of the epitaxial layer contacting the substrate.

In various embodiments of the present disclosure, the content of germanium, carbon or the both of the epitaxial layer has a maximum between a side of the epitaxial layer contacting one of the isolation structures and another side of the epitaxial layer contacting the substrate.

Further another aspect of the present invention is to provide a method for manufacturing a semiconductor device. The method includes the following steps. A gate trench is formed in a substrate. A channel layer is formed on a surface of the gate trench. The channel layer is formed of a material selected from the group consisting of silicon-germanium, silicon-carbon and a combination thereof. A gate stack is formed on the channel layer in the gate trench.

In various embodiments of the present disclosure, the channel layer is formed to abruptly or gradually increase the content of germanium, carbon or the both from a side of the channel layer contacting the substrate to another side of the channel layer contacting the gate trench.

In various embodiments of the present disclosure, the channel layer is formed to have a maximum content of germanium, carbon or the both between a side of the channel layer contacting one of the gate trench and another side of the channel layer contacting the substrate.

In various embodiments of the present disclosure, the method further includes the following steps. A plurality of isolation trenches are formed in the substrate. The gate stack is formed between adjacent two of the isolation trenches. An epitaxial layer is formed on a surface of each of the isolation trenches. The epitaxial layer is formed of a material consisting essentially of silicon-germanium, silicon-carbon, or silicon-carbon-germanium. A dielectric material is filled into each of the isolation trenches to form a plurality of isolation structures.

In various embodiments of the present disclosure, the epitaxial layer is formed to abruptly or gradually increase the content of germanium, carbon or the both from a side of the epitaxial layer contacting one of the isolation trenches to another side of the epitaxial layer contacting the substrate.

In various embodiments of the present disclosure, the epitaxial layer is formed to have a maximum content of germanium, carbon or the both between a side of the epitaxial layer contacting one of the isolation trenches and another side of the epitaxial layer contacting the substrate.

These and other features, aspects, and advantages of the present disclosure will become better understood with reference to the following description and appended claims.

It is to be understood that both the foregoing general description and the following detailed description are by examples, and are intended to provide further explanation of the invention as claimed.

BRIEF DESCRIPTION OF THE DRAWINGS

The disclosure could be more fully understood by reading the following detailed description of the embodiment, with reference made to the accompanying drawings as follows.

DETAILED DESCRIPTION

Reference will now be made in detail to the present embodiments of the invention, examples of which are illustrated in the accompanying drawings. Wherever possible, the same reference numbers are used in the drawings and the description to refer to the same or like parts.

The following embodiments are disclosed with accompanying diagrams for detailed description. For illustration clarity, many details of practice are explained in the following descriptions. However, it should be understood that these details of practice do not intend to limit the present invention. That is, these details of practice are not necessary in parts of embodiments of the present invention. Furthermore, for simplifying the drawings, some of the conventional structures and elements are shown with schematic illustrations.

Figure 1A:
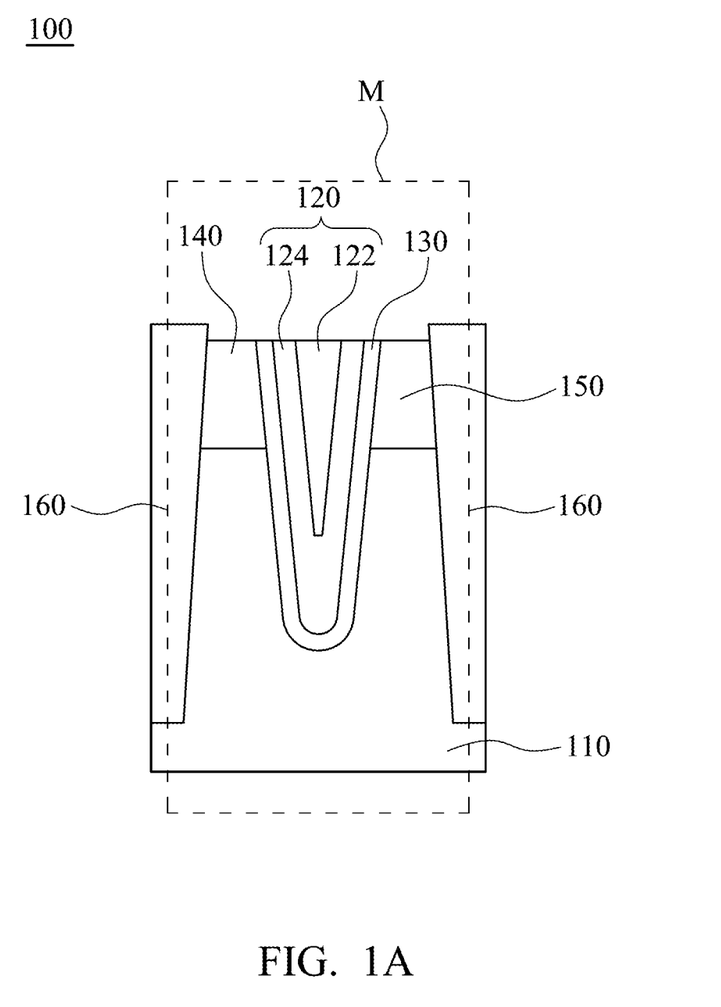
FIG. 1A is a schematic cross-sectional view of a semiconductor device according to various embodiment of the present disclosure.

FIG. 1A is a schematic cross-sectional view of a semiconductor device 100 according to various embodiment of the present disclosure. In FIG. 1A, the semiconductor device 100 includes a substrate 110, a gate structure 120, a channel layer 130, a first active region 140 and a second active region 150.

The gate structure 120 is disposed in the substrate 110. In accordance with various embodiments of the present disclosure, the substrate 110 is an NMOS substrate or a PMOS substrate. More particularly, the substrate 110 is a boron-doped silicon substrate.

In accordance with various embodiments of the present disclosure, the gate structure 120 includes a conductive portion 122 and an insulating portion 124. The insulating portion 124 is sandwiched between the conductive portion 122 and the channel layer 130. In accordance with various embodiments of the present disclosure, a material of the conductive portion 122 is metal or alloy. The metal and the alloy are individually selected from a group consisting of cupper, aluminum tungsten and a combination thereof. In accordance with various embodiments of the present disclosure, a material of the insulating portion 124 is a dielectric material, more particularly a high-k dielectric material.

In FIG. 1A, the channel layer 130 is sandwiched between the gate structure 120 and the substrate 110. A material of the channel layer 130 is selected from the group consisting of silicon-germanium epitaxial material, silicon-carbon epitaxial material, and a combination thereof. Due to the formation of the channel layer 130, the channel conductivity and carrier mobility of the semiconductor device (recessed access device) may be increase. Therefore, a performance of the semiconductor device is improved. In various embodiments of the present disclosure, the material of the channel layer 130 is $Si_{1-x}Ge_x$, $0<x\leq0.8$; $Si_{1-y}C_y$, $0<y\leq0.3$; or $Si_{1-a-b}Ge_aC_b$, $0<a\leq0.8$, $0<b\leq0.3$.

Figure 1B:
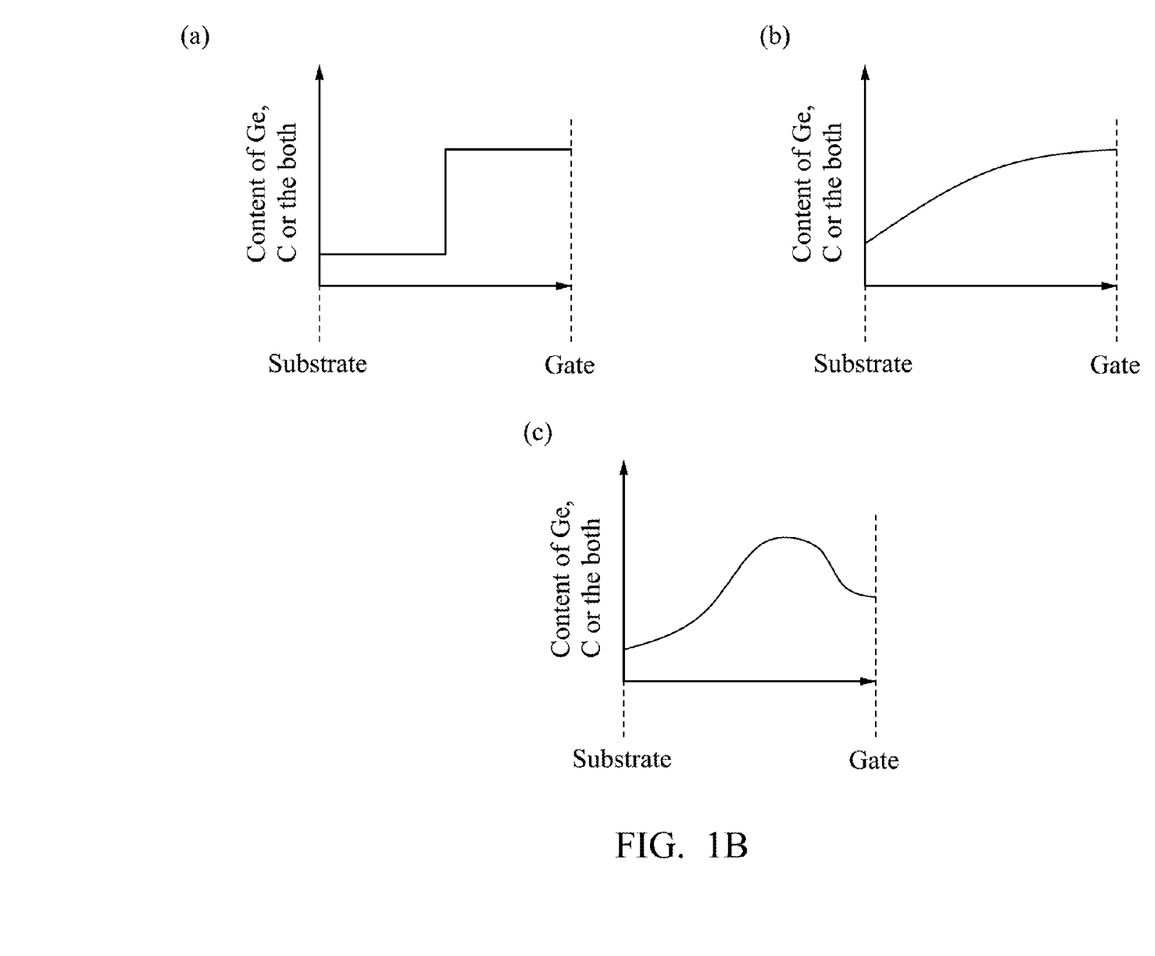
FIG. 1B shows several diagrams of the content of germanium, carbon or the both changing from a side of the epitaxial layer contacting one of the isolation structures and another side of the channel layer contacting the substrate according to various embodiment of the present disclosure.

FIG. 1B shows several diagrams of the content of germanium, carbon or the both changing from a side of the epitaxial layer contacting one of the isolation structures and another side of the channel layer contacting the substrate according to various embodiment of the present disclosure.

In FIG. 1B-(a), the content of germanium, carbon or the both of the channel layer is abruptly increased from a side of the channel layer contacting the substrate to another side of the channel layer contacting the gate structure.

In FIG. 1B-(b), the content of germanium, carbon or the both of the channel layer is gradually increased from a side of the channel layer contacting the substrate to another side of the channel layer contacting the gate structure.

In FIG. 1B-(c), the content of germanium, carbon or the both of the channel layer has a maximum between a side of the channel layer contacting the substrate and another side of the channel layer contacting the gate structure.

Referring to FIG. 1A, the first active region 140 and the second active region 150 are disposed in the substrate 110 and respectively disposed at opposite sides of the gate structure 120. In accordance with various embodiments of the present disclosure, the first active region 140 is a source region, and the second active region 150 is a drain region. In accordance with various embodiments of the present disclosure, a memory cell (M1) includes the gate structure 120, the first active region 140, and the second active region 150. In FIG. 1A, the semiconductor device 100 further includes a plurality of isolation structures 160 disposed in the substrate 110, and the memory cell (M1) disposed between adjacent two of the isolation structures 160. In accordance with various embodiments of the present disclosure, a material of the isolation structures 160 a dielectric material, more particularly a high-k dielectric material.

Figure 2:
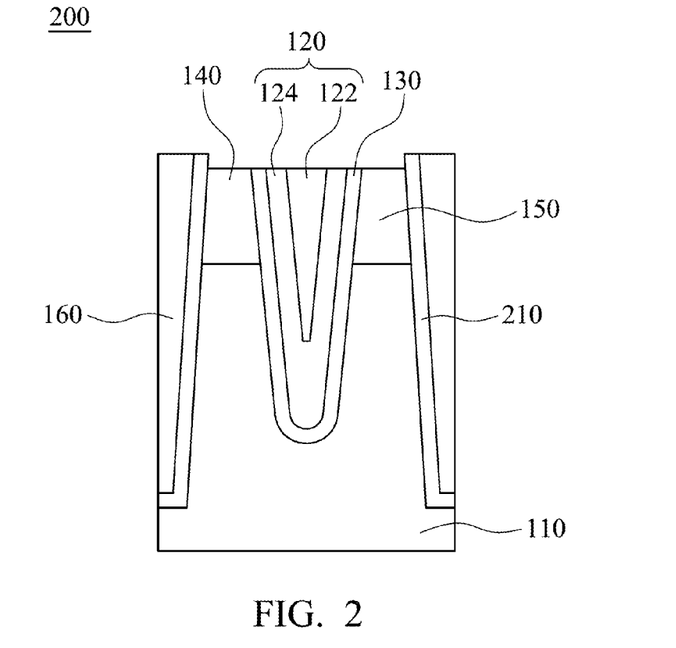
FIGS. 2-3 are schematic cross-sectional views of semiconductor devices according to various embodiment of the present disclosure.

FIG. 2 is a schematic cross-sectional view of a semiconductor device 200 according to various embodiment of the present disclosure. In FIG. 2, the semiconductor device 200 has a similar structure to the semiconductor device 100 in FIG. 1.

However, different from the semiconductor device 100, the semiconductor device 200 further includes an epitaxial layer 210 disposed between each of the isolation structures 160 and the substrate 110. The epitaxial layer 210 overlies a surface of each of the isolation structures 160. A material of the epitaxial layer 210 is selected from the group consisting of silicon-germanium epitaxial material, silicon-carbon epitaxial material, and a combination thereof. In various embodiments of the present disclosure, the material of the epitaxial layer 210 is $Si_{1-x}Ge_x$, $0<x\leq0.8$; $Si_{1-y}C_y$, $0<y\leq0.3$; or $Si_{1-a-b}Ge_aC_b$, $0<a\leq0.8$, $0<b\leq0.3$.

In various embodiments of the present disclosure, the content of germanium, carbon or the both of the epitaxial layer is abruptly or gradually increased from a side of the epitaxial layer contacting one of the isolation structures to another side of the epitaxial layer contacting the substrate. In various embodiments of the present disclosure, the content of germanium, carbon or the both of the epitaxial layer has a maximum between a side of the epitaxial layer contacting one of the isolation structures and another side of the epitaxial layer contacting the substrate.

Figure 3:
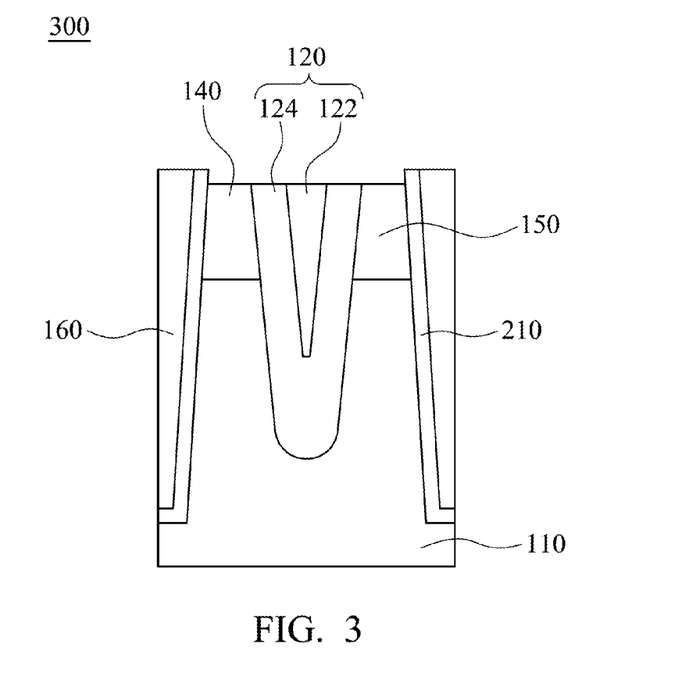

FIG. 3 is a schematic cross-sectional view of a semiconductor device 300 according to various embodiment of the present disclosure. In FIG. 3, the semiconductor device 300 has a similar structure to the semiconductor device 200 in FIG. 2. However, different from the semiconductor device 200, the semiconductor device 300 does not have a channel layer disposed between the gate structure 120 and the substrate 110.

Figure 4:
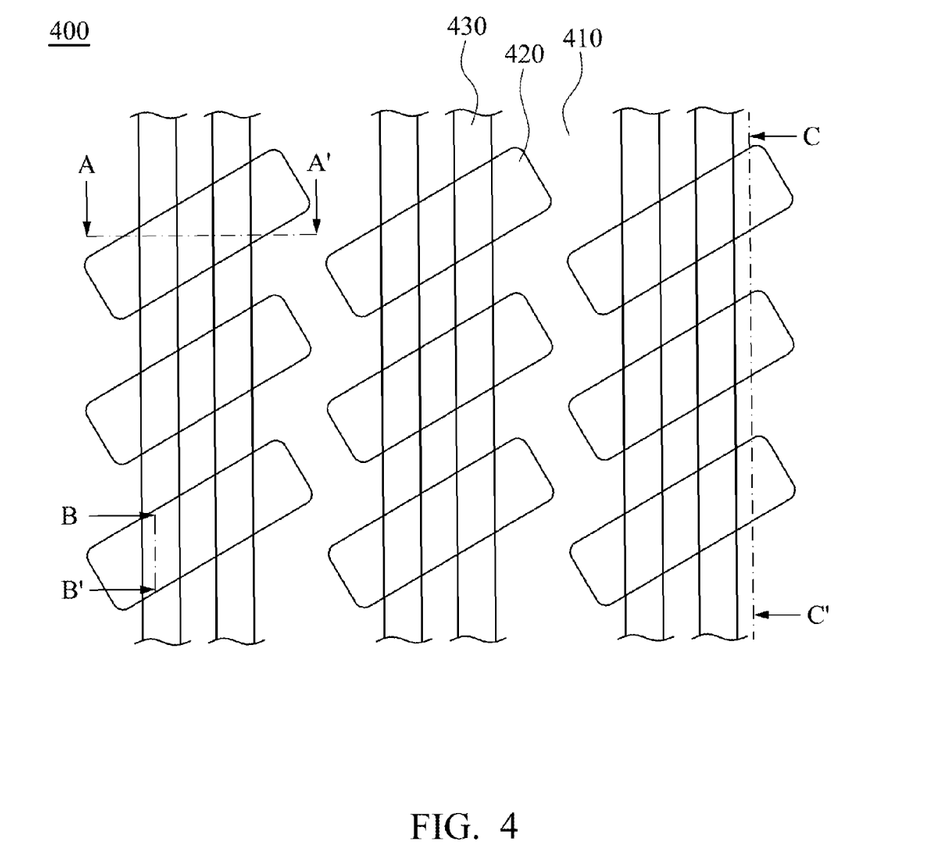
FIG. 4 is a top view of a memory device according to various embodiment of the present disclosure.

FIG. 4 is a top view of a memory device 400 according to various embodiment of the present disclosure. In FIG. 4, the memory device 400 includes a substrate 410, a plurality of memory cells 420 and a plurality of word lines 430 (also called gate structures).

Figure 5:
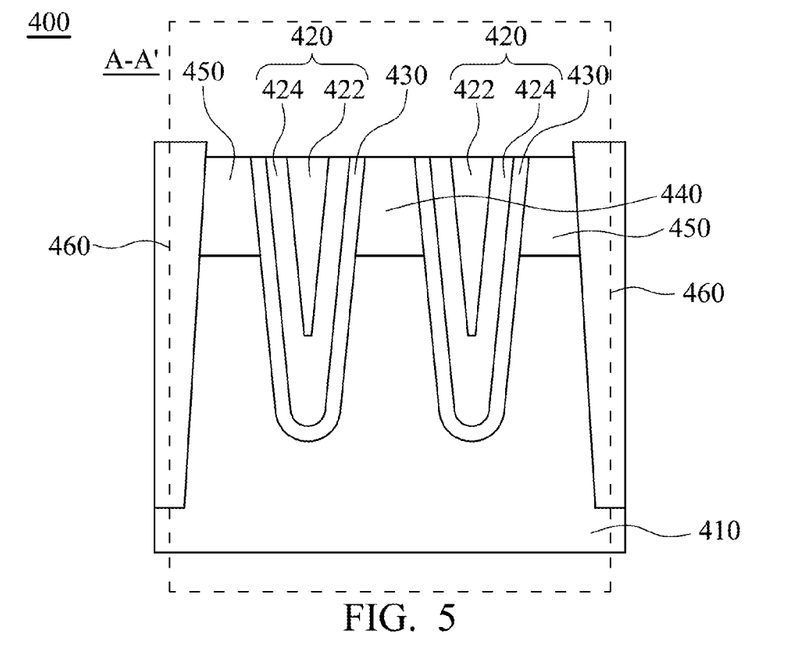
FIG. 5 is a schematic cross-sectional view of a memory device taken along A-A' line shown in FIG. 4.

FIG. 5 is a schematic cross-sectional view of a memory device 400 taken along A-A' line shown in FIG. 4. In FIG. 5, the memory device 400 includes a substrate 410, two gate structures 420, a channel layer 430, a first active region 440 and two second active regions 450.

The gate structures 420 are disposed in the substrate 410. In accordance with various embodiments of the present disclosure, each of the gate structures 420 includes a conductive portion 422 and an insulating portion 424. The insulating portion 424 is sandwiched between the conductive portion 422 and the channel layer 430.

In FIG. 5, the channel layer 430 is sandwiched between each of the gate structures 420 and the substrate 110. A material of the channel layer 430 is selected from the group consisting of silicon-germanium epitaxial material, silicon-carbon epitaxial material, and a combination thereof. In various embodiments of the present disclosure, the material of the channel layer 430 is $Si_{1-x}Ge_x$, $0<x\leq0.8$; $Si_{1-y}C_y$, $0<y\leq0.3$; or $Si_{1-a-b}Ge_aC_b$, $0<a\leq0.8$, $0<b\leq0.3$.

The first active region 440 and the second active regions 450 are disposed in the substrate 410. Each of the gate structure 420 is disposed between the first active region 440 and one of the second active regions 450. In accordance with various embodiments of the present disclosure, the first active region 440 is a source region, and the second active regions 450 is a drain region. In accordance with various embodiments of the present disclosure, a memory cell (M2) includes two of the gate structures 420, the first active region 440, and two of the second active regions 450. In FIG. 5, the semiconductor device 400 further includes a plurality of isolation structures 460 disposed in the substrate 410, and the memory cell (M2) disposed between adjacent two of the isolation structures 460.

Figure 6:
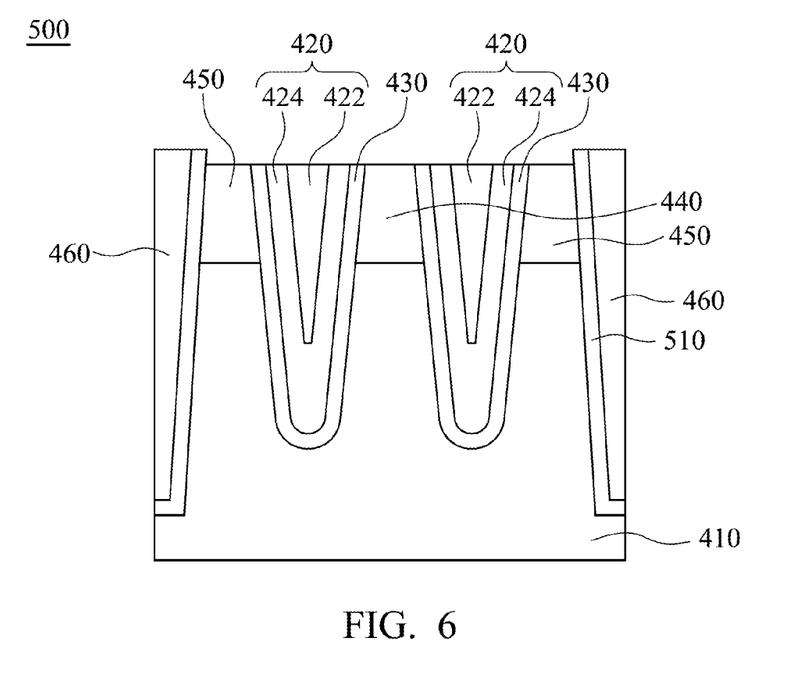
FIGS. 6-7 are schematic cross-sectional views of memory devices according to various embodiment of the present disclosure.

FIG. 6 is a schematic cross-sectional view of a memory device 500 according to various embodiment of the present disclosure. In FIG. 6, the memory device 500 has a similar structure to the semiconductor device 400 in FIG. 5. However, different from the semiconductor device 400, the semiconductor device 500 further includes an epitaxial layer 510 disposed between each of the isolation structures 460 and the substrate 410. The epitaxial layer 510 overlies a surface of each of the isolation structures 460. A material of the epitaxial layer 510 is selected from the group consisting of silicon-germanium epitaxial material, silicon-carbon epitaxial material, and a combination thereof. In various embodiments of the present disclosure, the material of the epitaxial layer 510 is $Si_{1-x}Ge_x$, $0<x\leq0.8$; $Si_{1-y}C_y$, $0<y\leq0.3$, or $Si_{1-a-b}Ge_aC_b$, $0<a\leq0.8$, $0<b\leq0.3$.

Figure 7:
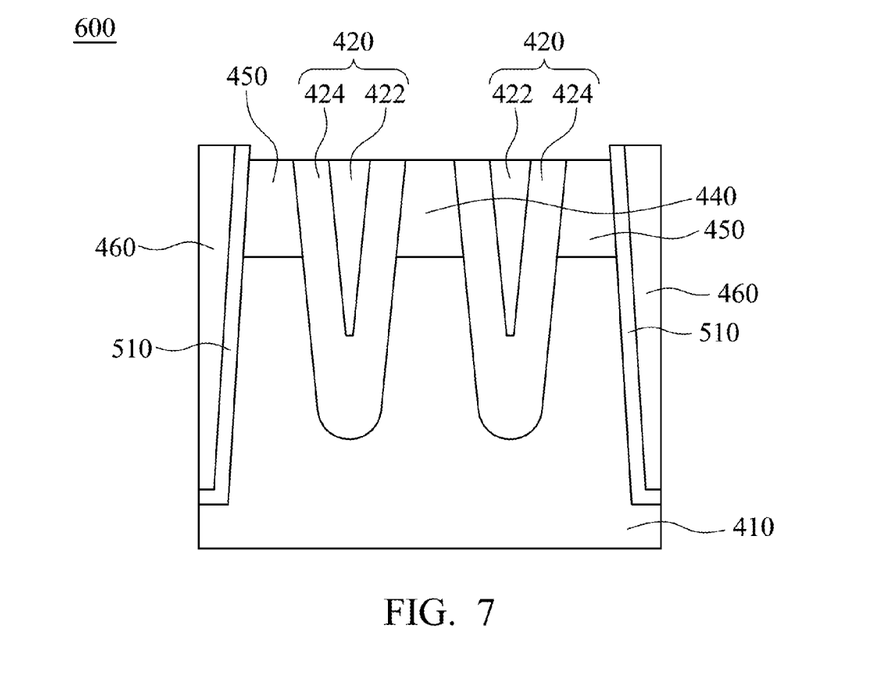

FIG. 7 is a schematic cross-sectional view of a memory device 600 according to various embodiment of the present disclosure. In FIG. 7, the semiconductor device 600 has a similar structure to the semiconductor device 500 in FIG. 6. However, different from the semiconductor device 500, the semiconductor device 600 does not have a channel layer disposed between the gate structure 420 and the substrate 410.

Figure 8:
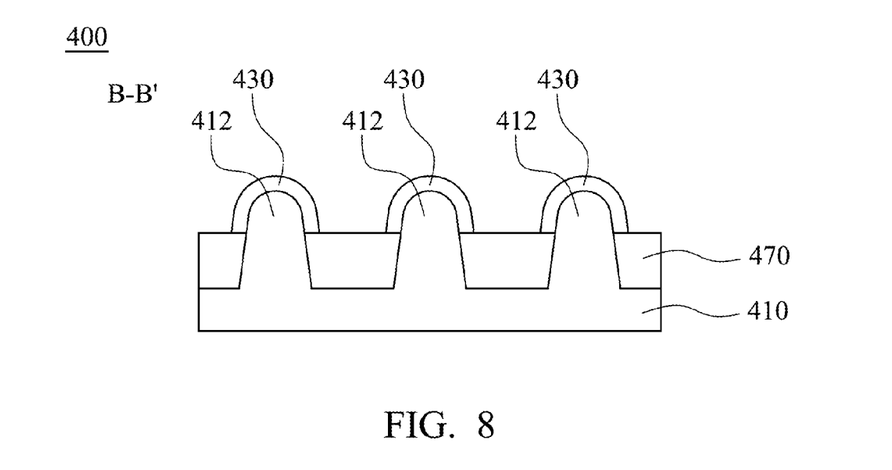
FIG. 8 is a schematic cross-sectional view of a memory device taken along B-B' line shown in FIG. 4.

FIG. 8 is a schematic cross-sectional view of the memory device 400 taken along B-B' line shown in FIG. 4. In FIG. 8, the memory device 400 includes the substrate 410, the channel layer 430 and a plurality of isolation structures 470. The isolation structures 470 are disposed in the substrate 410, and the substrate 410 has a plurality of channels 412 individually between two adjacent of the isolation structures 470. The channel layer 430 covers a top surface of each of the channels 412, but not extend to an interface between the channels 412 and the isolation structures 470.

Figure 9:
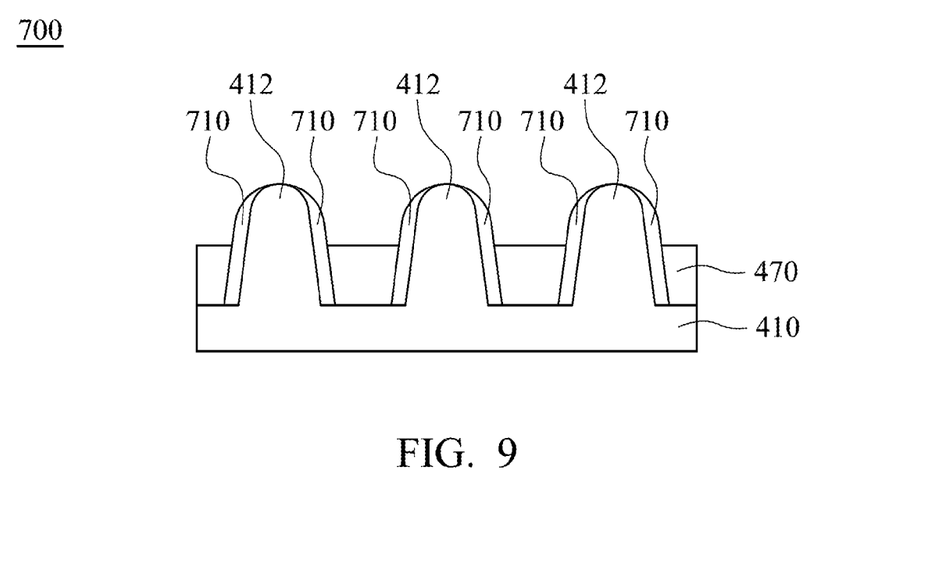
FIG. 9 is a schematic cross-sectional view of a memory device according to various embodiment of the present disclosure.

FIG. 9 is a schematic cross-sectional view of a memory device 700 according to various embodiment of the present disclosure. In FIG. 9, the memory device 700 has a similar structure to the memory device 400 in FIG. 8. However, different from the memory device 400, the memory device 700 has a channel layer 710 disposed between the channels 412 and the isolation structures 470, but not fully cover a top surface of each of the channels 412.

Figure 10:
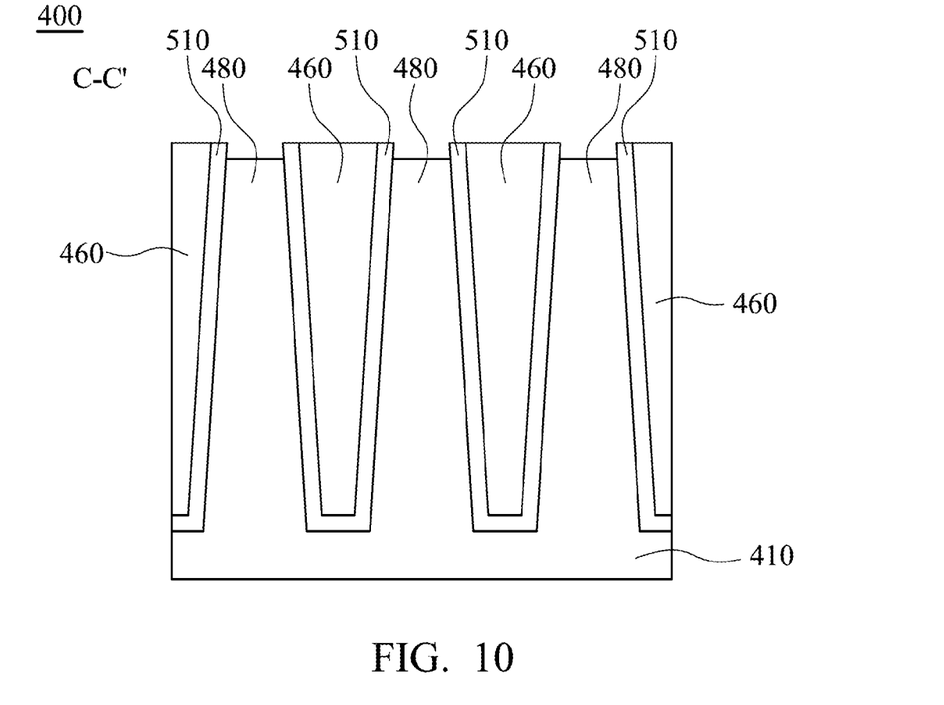
FIG. 10 is a schematic cross-sectional view of a memory device taken along C-C' line shown in FIG. 4.

FIG. 10 is a schematic cross-sectional view of a memory device taken along C-C' line shown in FIG. 4. In FIG. 10, the memory device 400 includes the substrate 410, the epitaxial layer 510 and a plurality of isolation structures 460. The isolation structures 460 are disposed in the substrate 410, and the substrate 410 has a plurality of active regions 480 individually between two adjacent of the isolation structures 460. The epitaxial layer 510 is disposed between the substrate 410 and each of the isolation structures 460.

Figure 11:
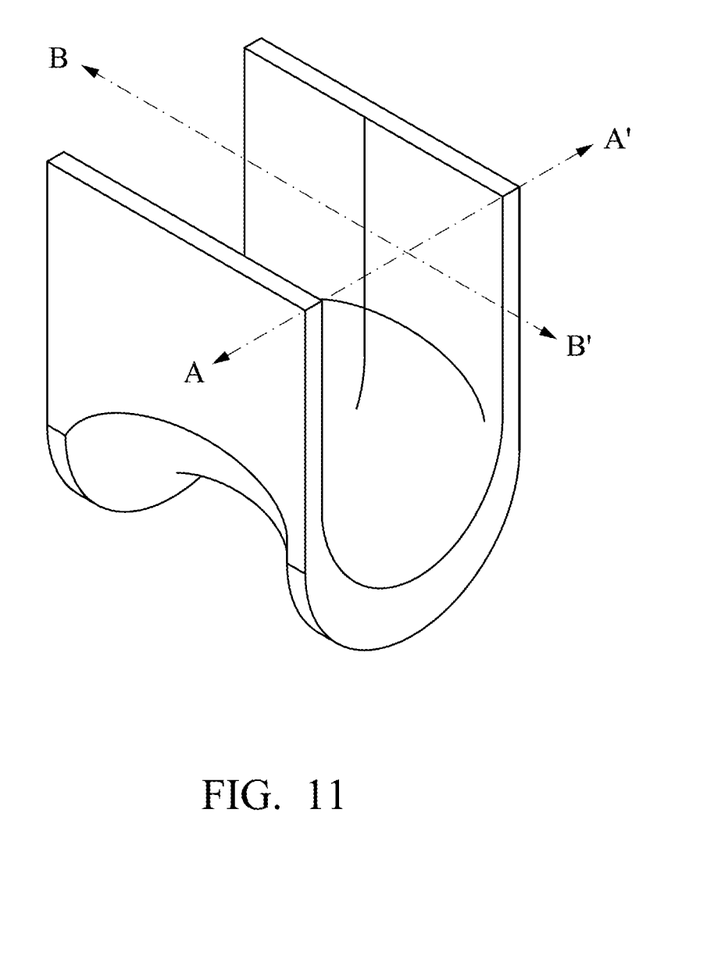
FIG. 11 a schematic three-dimensional view of a channel layer according to various embodiment of the present disclosure.

FIG. 11 a schematic three-dimensional view of the channel layer 430 according to various embodiment of the present disclosure. The channel layer 430 in FIG. 5 is the schematic cross-sectional view of which taken along A-A' line shown in FIG. 11. Further, the channel layer 430 in FIG. 8 is the schematic cross-sectional view of which taken along B-B' line shown in FIG. 11.

FIGS. 12A-12D are schematic cross-sectional views of a semiconductor device at various stages of fabrication according to various embodiment of the present disclosure.

Figure 12A:
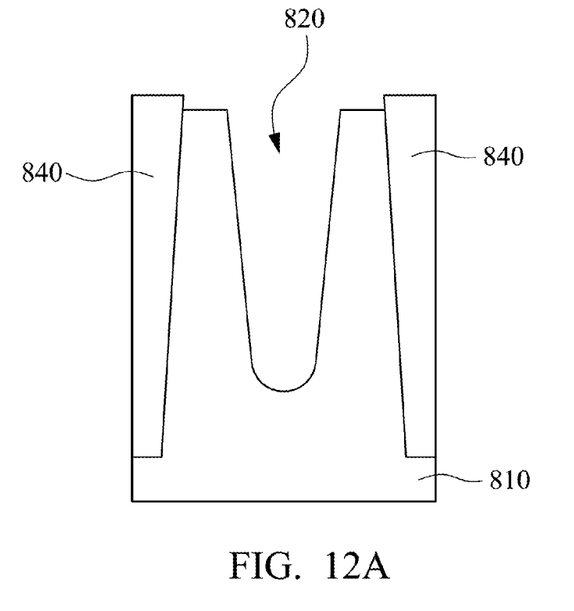
FIGS. 12A-12D are schematic cross-sectional views of a semiconductor device at various stages of fabrication according to various embodiment of the present disclosure.

In FIG. 12A, a gate trench 820 is formed in a substrate 810. In various embodiments of the present disclosure, the gate trench 820 is formed by an etching process, more particularly a dry etching process. In various embodiments of the present disclosure, a plurality of isolation structures 840 are formed in the substrate 810 to sandwich the gate trench 820.

Figure 12B:
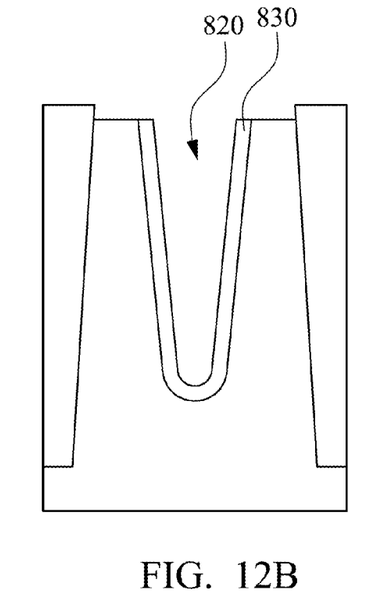

In FIG. 12B, a channel layer 830 is formed on a surface of the gate trench 820. The channel layer 830 is formed of a material selected from the group consisting of silicon-germanium, silicon-carbon and a combination thereof. In various embodiments of the present disclosure, the channel layer 830 is formed to abruptly or gradually increase the content of germanium, carbon or the both from a side of the channel layer 830 contacting the substrate 810 to another side of the channel layer 830 contacting the gate trench 820. In various embodiments of the present disclosure, a gate stack (not shown) is formed on the channel layer 830 in the gate trench 820.

Figure 12C:
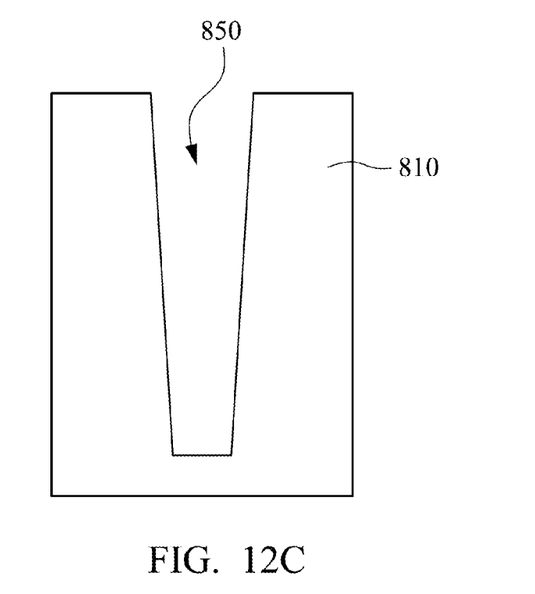

Referring to FIG. 12C, an isolation trench 850 is formed in the substrate 810. In various embodiments of the present disclosure, the gate stack (not shown) is formed between adjacent two of the isolation trenches 850.

Figure 12D:
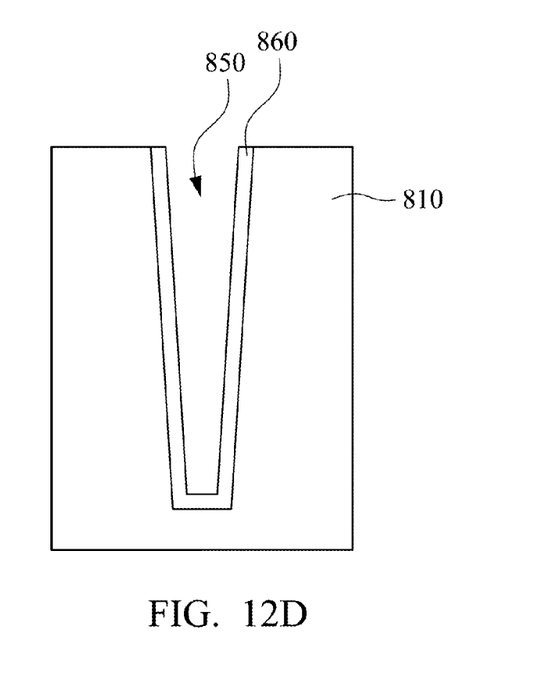

In FIG. 12D, an epitaxial layer 860 is formed on a surface of each of the isolation trenches 850. The epitaxial layer 860 is formed of a material consisting essentially of silicon-germanium, silicon-carbon, or silicon-carbon-germanium. In various embodiments of the present disclosure, the epitaxial layer 860 is formed to abruptly or gradually increase the content of germanium, carbon or the both from a side of the epitaxial layer 860 contacting one of the isolation trenches 850 to another side of the epitaxial layer 860 contacting the substrate 810. In various embodiments of the present disclosure, the epitaxial layer 860 is formed to have a maximum content of germanium, carbon or the both between a side of the epitaxial layer 860 contacting one of the isolation trenches 850 and another side of the epitaxial layer 860 contacting the substrate 810. In various embodiments of the present disclosure, a dielectric material (not shown) is filled into each of the isolation trenches 850 to form a plurality of isolation structures (not shown).

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A semiconductor device, comprising:
   a substrate;
   a gate structure disposed in the substrate;
   a channel layer sandwiched between the gate structure and the substrate, wherein a material of the channel layer is selected from the group consisting of silicon-germanium epitaxial material, silicon-carbon epitaxial material, and a combination thereof, and the content of germanium, carbon or the both of the channel layer is abruptly or gradually increased from a side of the channel layer contacting the substrate to another side of the channel layer contacting the gate structure; and
   a first active region and a second active region disposed in the substrate and respectively disposed at opposite sides of the gate structure.

2. The semiconductor device of claim 1, wherein the content of germanium, carbon or the both of the channel layer has a maximum between a side of the channel layer contacting the substrate and another side of the channel layer contacting the gate structure.

3. The semiconductor device of claim 1, wherein a memory cell comprises the first active region, the gate structure, and the second active region.

4. The semiconductor device of claim 3, further comprising a plurality of isolation structures disposed in the substrate, and the memory cell disposed between adjacent two of the isolation structures.

5. The semiconductor device of claim 4, further comprising an epitaxial layer disposed between each of the isolation structures and the substrate.

6. The semiconductor device of claim 5, wherein a material of the epitaxial layer is consisting essentially of silicon-germanium epitaxial material, silicon-carbon epitaxial material, or silicon-carbon-germanium epitaxial material.

7. The semiconductor device of claim 6, wherein the materials of the epitaxial layer and the channel layer are individually $Si_{1-x}Ge_x$, $0<x\leq0.8$; $Si_{1-y}C_y$, $0<y\leq0.3$; or $Si_{1-a-b}Ge_aC_b$, $0<a\leq0.8$, $0<b\leq0.3$.

8. The semiconductor device of claim 6, wherein the content of germanium, carbon or the both of the epitaxial layer is abruptly or gradually increased from a side of the epitaxial layer contacting one of the isolation structures to another side of the epitaxial layer contacting the substrate.

9. The semiconductor device of claim 6, wherein the content of germanium, carbon or the both of the epitaxial layer has a maximum between a side of the epitaxial layer contacting one of the isolation structures and another side of the epitaxial layer contacting the substrate.

10. A semiconductor device, comprising:
    a substrate;
    a gate structure disposed in the substrate;
    an active region disposed in the substrate and disposed at a side of the gate structure;
    an isolation structure disposed in the substrate and disposed between two adjacent of the active regions; and
    an epitaxial layer overlying a surface of the isolation structure, wherein a material of the epitaxial layer is selected from the group consisting of silicon-germanium, silicon-carbon, and a combination thereof.

11. The semiconductor device of claim 10, wherein the materials of the epitaxial layer and the channel layer are individually $Si_{1-x}Ge_x$, $0<x\leq0.8$; $Si_{1-y}C_y$, $0<y\leq0.3$; or $Si_{1-a-b}Ge_aC_b$, $0<a\leq0.8$, $0<b\leq0.3$.

12. The semiconductor device of claim 10, wherein the content of germanium, carbon or the both of the epitaxial layer is abruptly or gradually increased from a side of the epitaxial layer contacting one of the isolation structures to another side of the epitaxial layer contacting the substrate.

13. The semiconductor device of claim 10, wherein the content of germanium, carbon or the both of the epitaxial layer has a maximum between a side of the epitaxial layer contacting one of the isolation structures and another side of the epitaxial layer contacting the substrate.

* * * * *